United States Patent
Lee (10) Patent No.: US 7,859,109 B2
(45) Date of Patent: Dec. 28, 2010

(54) GALLIUM NITRIDE-BASED III-V GROUP COMPOUND SEMICONDUCTOR DEVICE AND METHOD OF MANUFACTURING THE SAME

(75) Inventor: Jong-Lam Lee, Pohang (KR)

(73) Assignees: Seoul Opto-Device Co., Ltd., Ansan-si (KR); Postech Academy-Industry Foundation, Pohang-si (KR)

( * ) Notice: Subject to any disclaimer, the term of this patent is extended or adjusted under 35 U.S.C. 154(b) by 646 days.

(21) Appl. No.: 10/597,200

(22) PCT Filed: Jan. 14, 2005

(86) PCT No.: PCT/KR2005/000150

§ 371 (c)(1),
(2), (4) Date: Jul. 14, 2006

(87) PCT Pub. No.: WO2005/069389

PCT Pub. Date: Jul. 28, 2005

(65) Prior Publication Data

US 2008/0230904 A1 Sep. 25, 2008

(30) Foreign Application Priority Data

Jan. 15, 2004 (KR) .................. 10-2004-0002849

(51) Int. Cl.
*H01L 23/48* (2006.01)
(52) U.S. Cl. .................. 257/751; 257/748; 257/99; 257/E21.476; 438/653
(58) Field of Classification Search ............. 257/751, 257/744.91, 96, 94, 98, 99, E21.746, E23.01; 438/653
See application file for complete search history.

(56) References Cited

U.S. PATENT DOCUMENTS

| 6,326,294 | B1* | 12/2001 | Jang et al. ............. 438/604 |
| 2002/0014630 | A1* | 2/2002 | Okazaki et al. ........... 257/79 |
| 2003/0001170 | A1* | 1/2003 | Shibata et al. ........... 257/189 |
| 2003/0015721 | A1* | 1/2003 | Slater et al. ............ 257/99 |
| 2003/0209720 | A1* | 11/2003 | Okazaki et al. ........... 257/98 |

FOREIGN PATENT DOCUMENTS

EP 0926744 6/1999

(Continued)

OTHER PUBLICATIONS

D. L. Hibbard, et al. "Low resistance High Reflectance Contacts to p-GaN Using Oxidized Ni/Au and Al or Ag", Applied Physics Letters, vol. 83, No. 2, Jul. 14, 2003. pp. 311-313.

(Continued)

*Primary Examiner*—Thinh T Nguyen
(74) *Attorney, Agent, or Firm*—H.C. Park & Associates, PLC (57) ABSTRACT

The present invention relates to a gallium nitride-based compound semiconductor device and a method of manufacturing the same. According to the present invention, there is provided a gallium nitride-based III-V group compound semiconductor device comprising a gallium nitride-based semiconductor layer and an ohmic electrode layer formed on the gallium nitride-based semiconductor layer. The ohmic electrode layer comprises a contact metal layer, a reflective metal layer, and a diffusion barrier layer.

13 Claims, 5 Drawing Sheets

FOREIGN PATENT DOCUMENTS

| | | |
|---|---|---|
| EP | 1168460 | 1/2002 |
| JP | 11-40846 | 2/1999 |
| JP | 2000-36619 | 2/2000 |
| JP | 2000-294837 | 10/2000 |
| WO | 0147038 | 6/2001 |
| WO | WO 02/099901 A1 | 12/2002 |

OTHER PUBLICATIONS

European Search Report dated Apr. 10, 2008.
English language abstract of Japanese Publication No. 11-40846.
English language abstract of Japanese Publication No. 2000-36619.
English language abstract of Japanese Publication No. 2000-294837.

* cited by examiner

GALLIUM NITRIDE-BASED III-V GROUP COMPOUND SEMICONDUCTOR DEVICE AND METHOD OF MANUFACTURING THE SAME

TECHNICAL FIELD

The present invention relates to a gallium nitride-based compound semiconductor device and a method of manufacturing the same, and more particularly, to a gallium nitride-based III-V group compound semiconductor device having an Me (=Ir, Ni, Pt)/Ag/Ru/Ni/Au ohmic electrode having low contact resistivity, high reflectance, and good thermal stability and a method oaf manufacturing the same.

BACKGROUND ART

Recently, light emitting diodes (LEDs) using a gallium nitride-based semiconductor (hereinafter, referred to as GaN LEDs) have been expected to be substituted for conventional light sources such as incandescent lamps, fluorescent lamps, and mercury lamps. Therefore, active research has been done on high-power GaN LEDs. In general, since a GaN LED film layer is grown on a sapphire substrate that is an insulator, the associated LED device has a horizontal structure. As a result, the conventional LED device has disadvantageously a high operation voltage and a low light output because current spreading resistance increases during a high power operation thereof. In addition, the conventional LED device has also disadvantageously poor thermal stability because heat generated during the operation thereof cannot be efficiently dissipated from the sapphire substrate.

In order to solve the aforementioned problems, a flip-chip packaging method has been proposed to implement a high-power GaN LED. Since light emits upwards through the sapphire substrate from an active layer of the GaN LED having a flip-chip structure, a thick p-type ohmic electrode can be substituted for a transparent electrode, so that the current spreading resistance can be reduced. At this time, a material constituting the p-type ohmic electrode should have low absorbance and high reflectance. Since metals such as Ag and Al having a reflectance of 90% or more have a low work function, these metals are not suitable for contact metals of the p-type GaN ohmic electrode. On the other hand, with respect to an InGaN LED device, research has rarely been done on a high-reflectance p-type ohmic electrode in comparison to a conventional p-type transparent electrode.

A recent research shows that, an Ni/Au transparent electrode on which Al and Ag reflective layers are deposited can have a reflectance of 70% or more in a blue light range (see Appl. Phys. Lett. vol. 83, p. 311 (2003)). However, there is a problem in that properties of the electrodes drastically deteriorate at a temperature of 100° C. or more.

DISCLOSURE

Technical Problem

The present invention is conceived to solve the aforementioned problems in the prior art. Accordingly, an object of the present invention is to provide a gallium nitride-based III-V group compound semiconductor device and a method of manufacturing the same capable of improving performance of the device by forming an ohmic electrode having good thermal stability, improved contact resistivity, and highly-maximized reflectance.

Technical Solution

According to an aspect of the present invention for achieving the objects, there is provided a gallium nitride-based III-V group compound semiconductor device. The semiconductor device comprises a gallium nitride-based semiconductor layer and an ohmic electrode layer formed on the gallium nitride-based semiconductor layer. The ohmic electrode layer comprises a contact metal layer, a reflective metal layer, and a diffusion barrier layer.

The ohmic electrode layer may further comprise at least one bonding metal layer. The ohmic electrode layer may be formed by sequentially laminating the contact metal layer, the reflective metal layer, the diffusion barrier layer, and the bonding metal layer. The contact metal layer may comprise at least one of Ni, Ir, Pt, Pd, Au, Ti, Ru, W, Ta, V, Co, Os, Re, and Rh. The reflective metal layer may comprise at least one of Al and Ag. The diffusion barrier layer may comprise at least one of Ru, Ir, Re, Rh, Os, V, Ta, W, ITO (Indium Tin Oxide), IZO (Indium Zinc oxide), $RuO_2$, $VO_2$, MgO, $IrO_2$, $ReO_2$, $RhO_2$, $OsO_2$, $Ta_2O_3$, and $WO_2$. The bonding metal layer may comprise first and second bonding metal layers, said first bonding metal layer comprising at least one of Ni, Cr, Ti, Pd, Ru, Ir, Rh, Re, Os, V, and Ta, said second bonding metal layer comprising at least one of Au, Pd, and Pt.

According to another aspect of the present invention for achieving the objects, there is provided a method of manufacturing a gallium nitride-based III-V group compound semiconductor device. The method comprises steps of: forming a gallium nitride-based semiconductor layer having a PN contact structure on a substrate; and forming an ohmic electrode layer on the semiconductor layer. The ohmic electrode layer comprises a contact metal layer, a reflective metal layer, and a diffusion barrier layer.

The step of forming the ohmic electrode layer may comprise steps of: sequentially laminating the contact metal layer, the reflective metal layer, and the diffusion barrier layer on the semiconductor layer; performing a thermal treatment process; and forming a bonding metal layer on the diffusion barrier layer. The step of forming the ohmic electrode layer comprises steps of: sequentially laminating the contact metal layer, the reflective metal layer, the diffusion barrier layer and bonding metal layer on the semiconductor layer; and performing a thermal treatment process. The thermal treatment process may be a rapid thermal annealing process performed under an atmosphere of 5 to 100% oxygen at a temperature of 100 to 700° C. for 10 to 100 seconds.

DESCRIPTION OF DRAWINGS

The above and other features and advantages of the present invention will become more apparent by describing in detail exemplary embodiments thereof with reference to the attached drawings in which.

BEST MODE

Hereinafter, a gallium nitride-based compound semiconductor device comprising an ohmic electrode layer and a method of manufacturing the same will be described with reference to the accompanying drawings. The ohmic electrode layer includes a reflective metal layer made of Ag, a diffusion barrier layer made of Ru, a first bonding metal layer made of Ni, and a second bonding metal layer made of Au.

Figure 1:
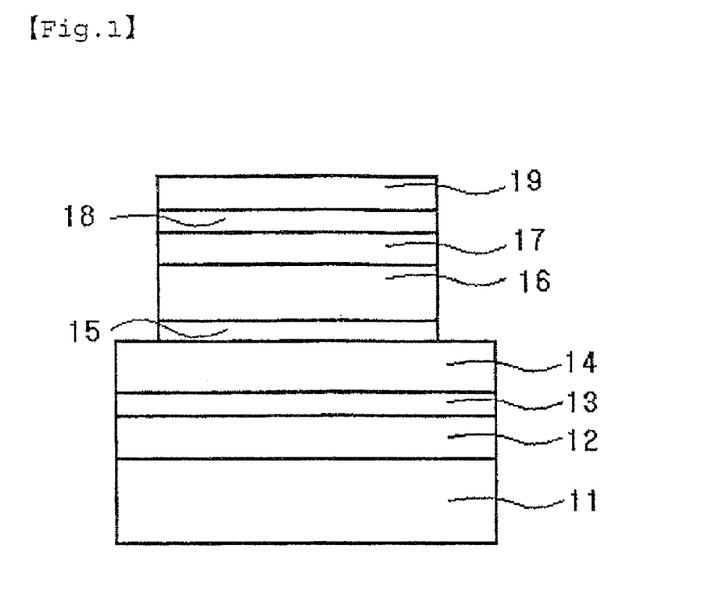
FIG. 1 is a schematic cross-sectional view showing a p-type ohmic electrode of a gallium nitride-based compound semiconductor layer according to an embodiment of the present invention.

FIG. 1 is a schematic cross-sectional view showing a configuration of an ohmic electrode of a gallium nitride-based compound semiconductor layer according to an embodiment of the present invention.

Referring to FIG. 1, an n-type GaN layer 12, an active layer 13, and a p-type GaN layer 14 are sequentially formed on a substrate 11. Then, a multi-layered ohmic electrode layer is formed by sequentially depositing contact metal/Ag/Ru/Ni/Au metal layers 15 to 19 on the p-type GaN layer 14. The ohmic electrode layer has a total thickness of 300 to 23,000 Å, and more preferably, 2,000 to 5,000 Å. The contact metal layer 15 has a thickness of 5 to 500 Å, and more preferably, 200 Å or less. In addition, the contact metal layer 15 may be formed as a multi-layered thin film. The Ag layer 16 has a thickness of 100 to 9,000 Å, and more preferably, 1,000 to 2,000 Å. The Ru layer 17 has a thickness of 50 to 1,000 Å, and more preferably, 100 to 800 Å. The Ni layer 18 has a thickness of 100 to 3,000 Å, and more preferably, 1,000 Å or less. The Au layer 19 has a thickness of 100 to 9,000 Å, and more preferably, 1,000 Å or less. The thickness of the contact metal layer 15 is selected within the aforementioned range in order to control absorbance of light.

The contact metal layer 15 is made of one of Ni, Ir, Pt, Pd, Au, Ti, Ru, W, Ta, V, Co, Os, Re, and Rh. Alternatively, the contact metal layer 15 may be formed by alternately laminating two different metals of the above-listed metals. Preferably, the contact metal layer 15 is formed by laminating Ni, Ir, and Pt layers.

A method of forming the multi-layered ohmic electrode layer is as follows. Firstly, the n-type GaN layer 12, the active layer 13, and the p-type GaN layer 14 are sequentially formed on a sapphire substrate 11. Next, the p-type GaN layer 14 is subject to a mesa-etching process using inductively coupled plasma (ICP), a surface treatment process, a lithography process, a metal thin film deposition process, and a lift-off process, so that a metal electrode pattern is obtained. The surface treatment process for the p-type GaN layer 14 is performed by immersing the p-type GaN layer 14 in aqua regia (HCl:HNO3=3:1) for ten minutes, cleaning the resultant product with de-ionized water, and drying the resultant product with nitrogen.

Before the metal layer is deposited, another surface treatment process is performed with a solution of HCl and de-ionized water (1:1) for one minute. Then, in an e-beam evaporator, metal (Me=Ir, Ni, Pt)/Ag/Ru/Ni/Au layers 15 to 19 are sequentially deposited to form an ohmic electrode. Next, the ohmic electrode is subject to a rapid thermal annealing process under an atmosphere of 5% or more oxygen at a temperature of 100 to 700° C. for 10 or more seconds. That is, the rapid thermal annealing process is preferably performed under an atmosphere of 5 to 100% oxygen at a temperature of 100 to 700° C. for about 10 to 100 seconds. Next, the electrical properties of the ohmic electrode are measured, so that contact resistivity thereof is calculated.

More preferably, the contact metal (Me=Ir, Ni, Pt), Ag, and Ru layers 15 to 17 are sequentially deposited on the p-type GaN layer 14. Then, the resultant product is subject to a thermal treatment process under an oxygen atmosphere. Since the Ru layer 17 serves as a diffusion barrier layer formed on the Ag layer 16 which serves as a reflective layer, it is possible to prevent diffusion and oxidation of Ag in the Ag layer 16 during the thermal treatment process. Next, the Ni and Au layers 18 and 19 are sequentially deposited on the Ru layer 17, so that the ohmic electrode can be obtained.

Alternatively, an ohmic electrode having a condensed structure may be obtained by sequentially forming the contact metal (Me=Ir, Ni, Pt), Ag, Ru, Ni, and Au layers 15 to 19 and performing a thermal treatment process on the resultant product under an oxygen atmosphere. After the ohmic electrode is formed, a pattern for the ohmic electrode may be formed on the p-type GaN layer 14. In addition, the ohmic electrode may be formed on the n-type nitride layer.

The gallium nitride-based III-V group compound semiconductor is preferably at least one selected from a group of GaN, InGaN, AlGaN, and AlInGaN. The substrate is preferably one of a sapphire substrate, a silicon carbide (SiC) substrate, a silicon (Si) substrate, a zinc oxide (ZnO) substrate, a gallium arsenide (GaAs) substrate, and a gallium phosphate (GaP) substrate. The substrate is more preferably the sapphire substrate.

Figure 2:
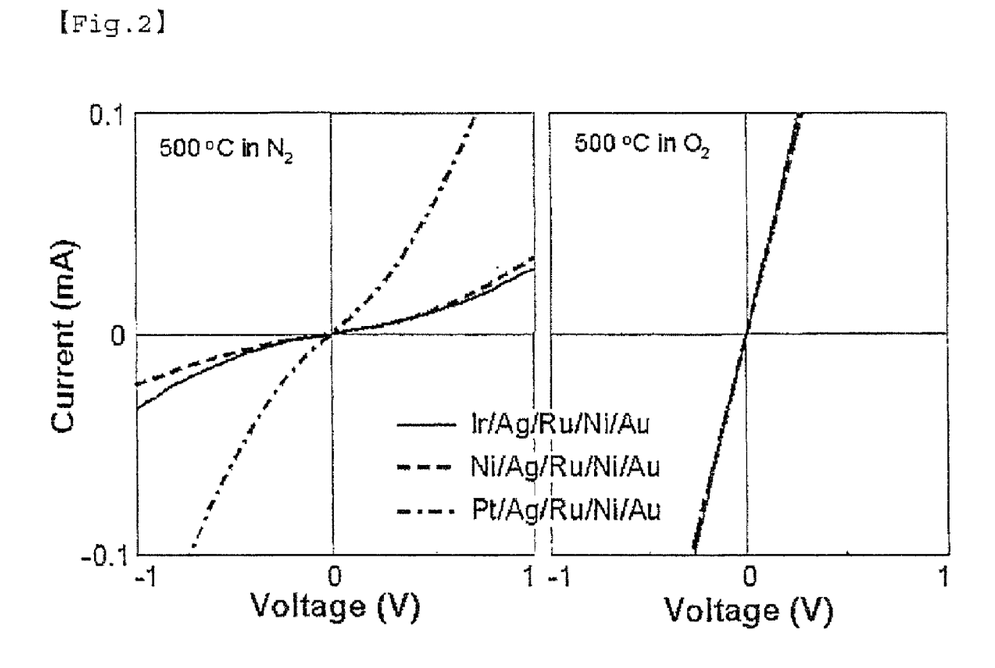
FIG. 2 is a graph showing current versus voltage of ohmic electrodes according to the present invention under different thermal treatment atmospheres.

FIG. 2 is a graph showing current versus voltage of Me (=Ir, Ni, Pt)/Ag/Ru/Ni/Au p-type ohmic electrodes manufactured by performing thermal treatment processes for two minutes at a temperature of 500° C. under different atmospheres of oxygen and nitrogen. In comparison to the nitrogen-atmosphere thermal treatment process, the oxygen-atmosphere thermal treatment process results in the ohmic property of the improved current-voltage properties.

Figure 3:
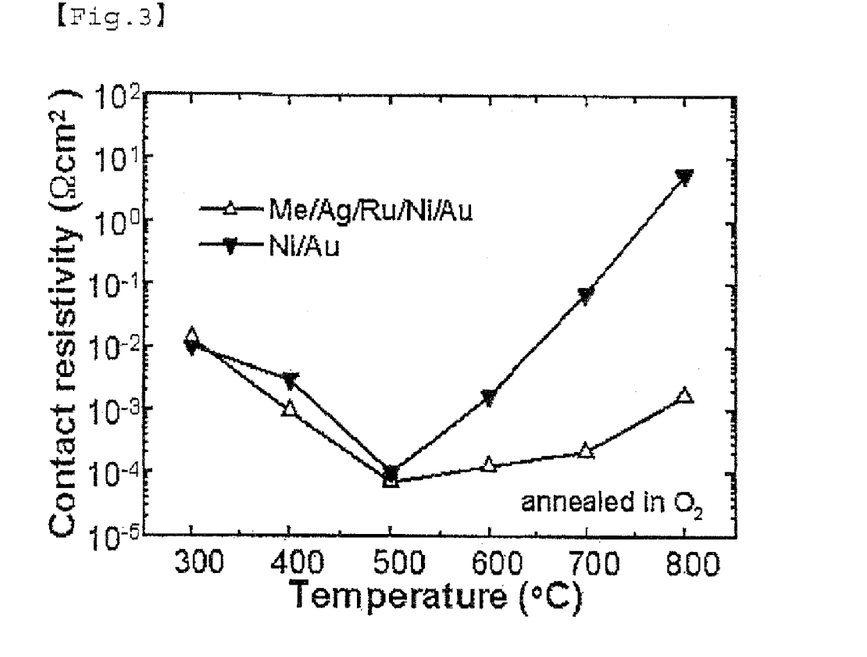
FIG. 3 is a graph showing contact resistivity of the ohmic electrode according to the present invention and a conventional Ni/Au ohmic electrode with respect to thermal treatment temperature.

FIG. 3 is a graph showing changes of contact resistivities of the Me (=Ir, Ni, Pt)/Ag/Ru/Ni/Au ohmic electrode according to the present invention and a conventional Ni(200 Å)/Au (1000 Å) ohmic electrode with respect to oxygen-atmosphere thermal treatment temperature.

As shown in the figure, a low contact resistivity of $7 \times 10^{-5}$ $\Omega cm^2$ is obtained by performing a thermal treatment process at a temperature of 500° C. It should be noted that, during a high temperature thermal treatment process, the contact resistivity of the Me/Ag/Ru/Ni/Au ohmic electrode relatively slowly increases, whereas the contact resistivity of the conventional Ni/Au electrode rapidly increases.

Accordingly, it can be understood that the multi-layered p-type ohmic electrode according to the present invention has good thermal stability.

Figure 4:
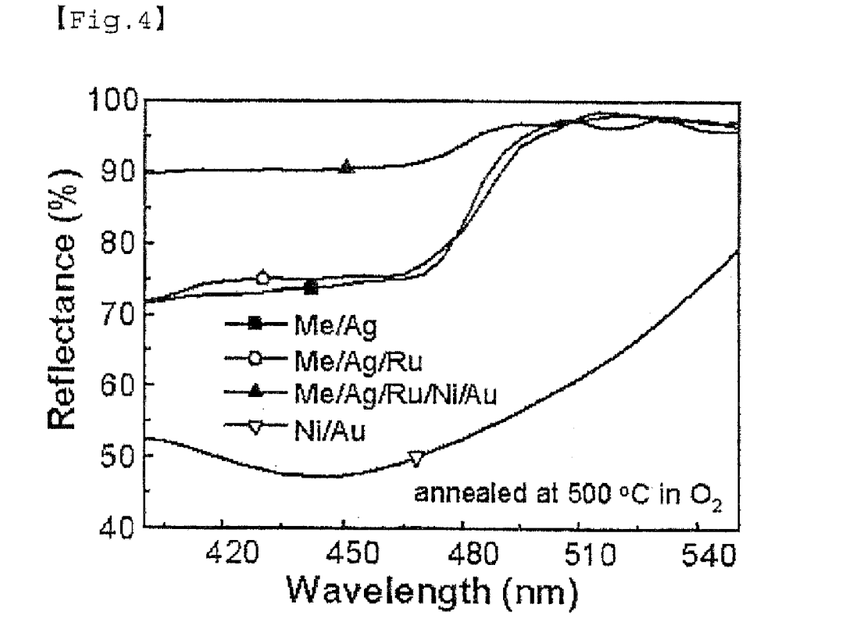
FIG. 4 is a graph showing reflectance of the ohmic electrode according to the present invention and a conventional Ni/Au ohmic electrode.

FIG. 4 is a graph showing reflectance of Me/Ag, Me/Ag/Ru, Me/Ag/Ru/Ni/Au ohmic electrodes according to the present invention and the conventional Ni/Au p-type ohmic electrode with respect to wavelength of light. As shown in the figure, at a wavelength of 470 nm, the reflectance of the Me/Ag and Me/Ag/Ru ohmic electrodes is 75%, but the reflectance of the Me/Ag/Ru/Ni/Au ohmic electrode is 90%, which is very high. In addition, it should be noted that the reflectance of the conventional Ni/Au ohmic electrode is 50%. Accordingly, it can be understood that the Me/Ag/Ru/Ni/Au p-type ohmic electrode according to the present invention is very suitable for a high-reflectance electrode of a flip-chip LED.

Figure 5:
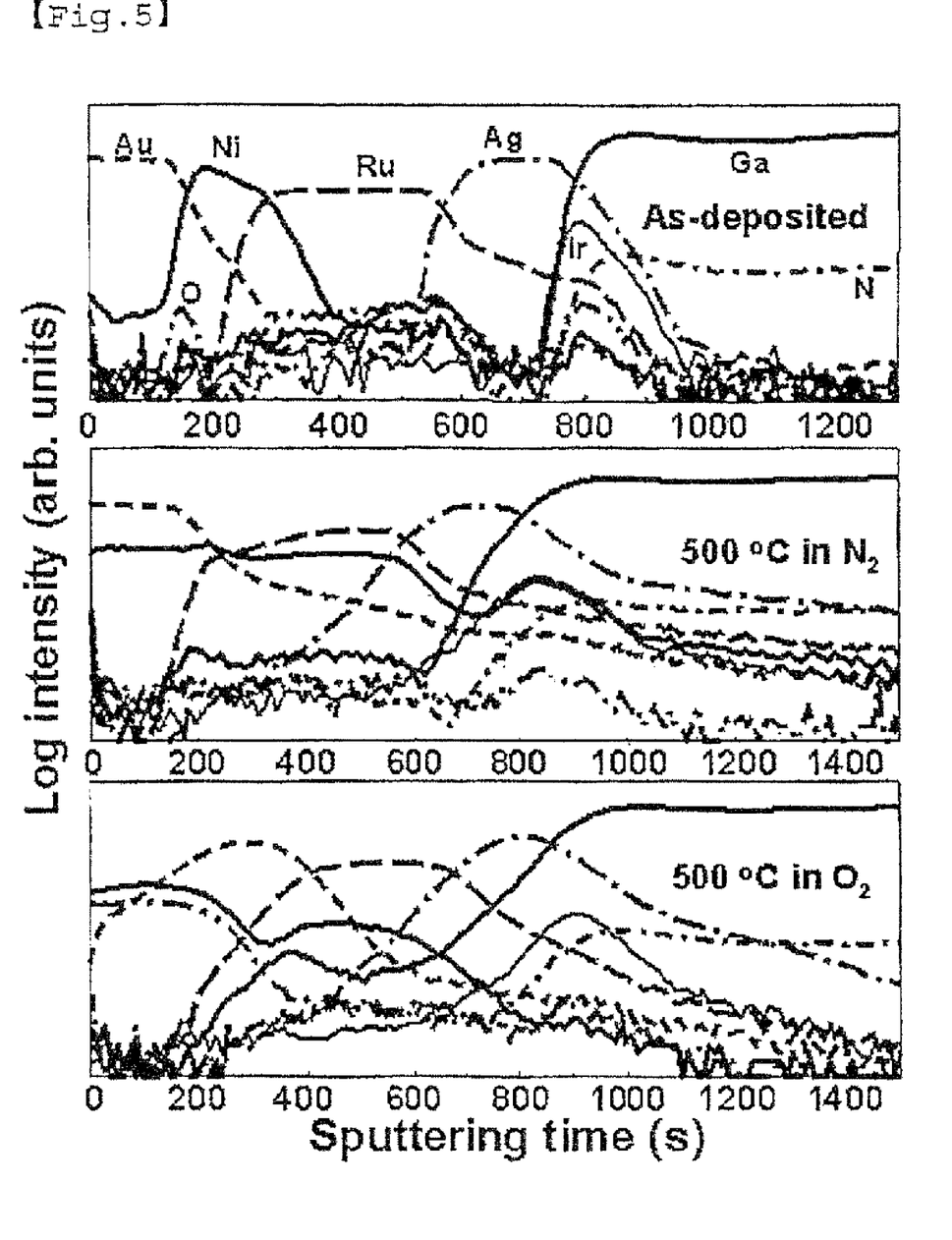
FIG. 5 is a graph showing depth profiles of an ohmic electrode according to the present invention, wherein the depth profiles are measured by using a secondary ion-mass spectroscopy (SIMS) with respect to thermal treatment conditions.

FIG. 5 is a graph showing depth profiles of an Ir/Ag/Ru/Ni/Au ohmic electrode manufactured by performing a thermal treatment process at a temperature of 500° C. for two minutes, wherein the depth profiles are obtained by using a secondary ion-mass spectroscopy (SIMS).

In comparison to the nitrogen-atmosphere thermal treatment process, external diffusion of Ga greatly increases by the oxygen-atmosphere thermal treatment process. Therefore, it can be understood that a larger number of Ga-vacancies are generated at an interface between GaN and metal layers after the oxygen-atmosphere thermal treatment process. The Ga-vacancies serve as acceptors for generating holes, so that the contact resistivity can be further lowered after the oxygen-atmosphere thermal treatment process. Even though the nitrogen- and oxygen-atmosphere thermal treatment processes are performed, the external diffusion of Ag does not occur in a surface of the Ag layer. Therefore, it can be understood that the Ru layer serves as a diffusion barrier layer for preventing external diffusion of Ag. In addition, after oxygen-atmosphere thermal treatment process, AgO is not generated. Therefore, it can be understood that the Ag layer performs its inherent role as a reflective layer. Accordingly, it is possible to obtain high reflectance and good thermal stability by using the ohmic electrode according to the present invention.

Figure 6:
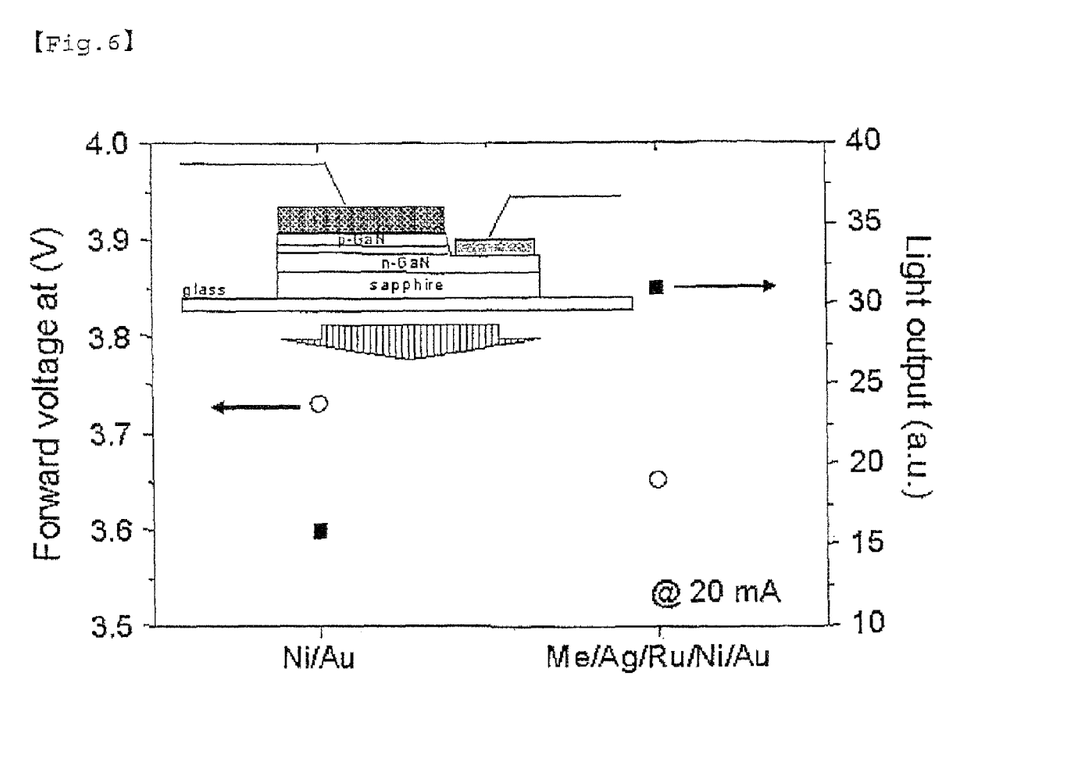
FIG. 6 is a graph showing operation voltage and light output of flip-chip light emitting diodes manufactured by using an ohmic electrode according to the present invention and a conventional Ni/Au ohmic electrode.

FIG. 6 is a graph showing operation voltage and light output of (300 μm×300 μm) InGaN flip-chip LEDs manufactured by using an Me/Ag/Ru/Ni/Au ohmic electrode according to the present invention and a conventional Ni/Au p-type ohmic electrode. For reference, a figure that schematically shows a method of measuring light outputs of the LEDs is inserted in FIG. 6. At an applied current of 20 mA, the operation voltage of the LED decreases from 3.73 V to 3.65 V, and the light output of the LED greatly increases from 16 a.u. to 31 a.u. Accordingly, in comparison to the conventional Ni/Au ohmic electrode, the high-reflectance Me/Ag/Ru/Ni/Au ohmic electrode according to the present invention improves the properties of the gallium nitride-based III-V group compound LED device.

Figure 7:
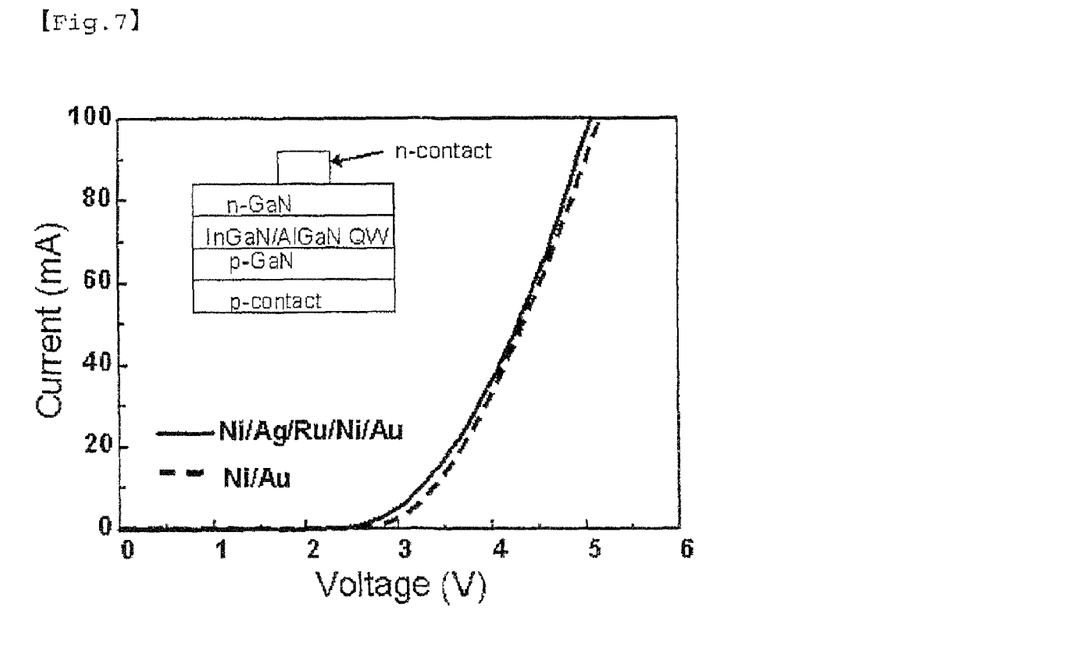
FIG. 7 is a graph showing operation voltage of vertical-structure light emitting diodes manufactured by using an ohmic electrode according to the present invention and a conventional Ni/Au ohmic electrode.
Figure 8:
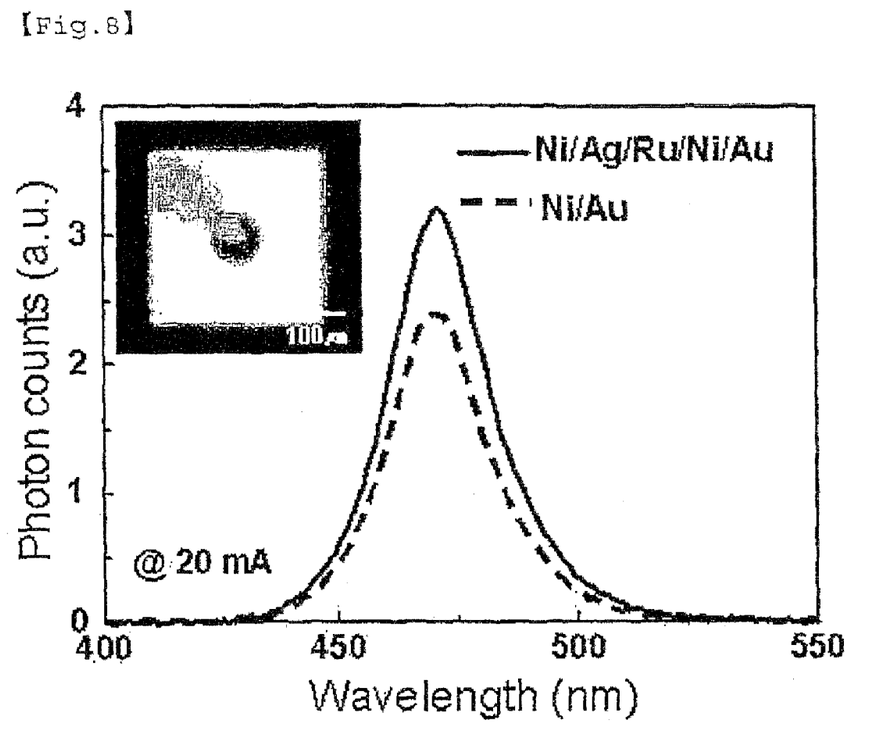
FIG. 8 is a graph showing light output of the vertical-structure light emitting diodes manufactured by using an ohmic electrode according to the present invention and a conventional Ni/Au ohmic electrode.
Figure 9:
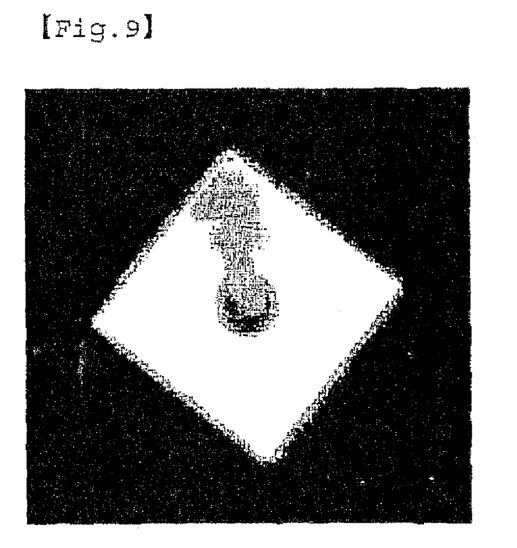
FIG. 9 is a photograph of the vertical-structure LED.

FIGS. 7 and 8 are graphs showing operation voltage and light output of (300 μm×300 μm) InGaN vertical-structure LEDs manufactured by using an Me/Ag/Ru/Ni/Au ohmic electrode according to the present invention and a conventional Ni/Au p-type ohmic electrode, respectively. In FIG. 7, a cross-sectional view of the vertical-structure LED is inserted. FIG. 9 shows a photograph of the vertical-structure LED.

As shown in FIGS. 7 and 8, at an applied current of 20 mA, the operation voltage of the LED using the high-reflectance Me/Ag/Ru/Ni/Au ohmic electrode decreases by about 0.1 V, and the light output of the LED increases by about 30%.

According to the present invention, after an oxygen-atmosphere thermal treatment process, an Me (=Ir, Ni, Pt)/Ag/Ru/Ni/Au ohmic electrodes has low contact resistivity, high thermal stability, and a high reflectance up to about 90%. By employing the Me/Ag/Ru/Ni/Au ohmic electrode, it is possible to implement a gallium nitride-based III-V group compound semiconductor device having high reliability.

The scope of the present invention is not limited to the embodiment described and illustrated above but is defined by the appended claims. It will be apparent that those skilled in the art can make various modifications and changes thereto within the scope of the invention defined by the claims. Therefore, the true scope of the present invention should be defined by the technical spirit of the appended claims.

INDUSTRIAL APPLICABILITY

As described above, the diffusion barrier layer is interposed between the lower contact and reflective metal layers and the bonding metal layer, so that an ohmic electrode layer having low contact resistivity and improved reflectance can be obtained. In this case, the bonding metal layer is formed after the contact and reflective metal layers are formed. However, if a predetermined thermal treatment process is performed, the bonding metal layer is diffused into a lower layer, so that the properties of the lower contact and reflective metal layers are deteriorated. In order to solve the problem, the reflective metal layer and the diffusion barrier layer are sequentially formed, and then, an oxygen-atmosphere thermal treatment process is performed. As a result, a layer for protecting the lower metal layer can be obtained. That is, in a case where the diffusion barrier layer is made of Ru, the Ru is deposited on the reflective metal layer, and the oxygen-atmosphere thermal treatment process is performed, so that the Ru is oxidized into RuO2. As a result, it is possible to effectively protect the reflective metal layer.

The invention claimed is:

1. A gallium nitride-based III-V group compound semiconductor device comprising:
   a gallium nitride-based semiconductor layer; and
   a p-type ohmic electrode layer formed on the gallium nitride-based semiconductor layer,
   wherein the p-type ohmic electrode layer comprises a contact metal layer, a reflective metal layer, and a diffusion barrier layer, the reflective metal layer being disposed between the contact metal layer and the diffusion barrier layer and being in direct contact with both the contact metal layer and the diffusion barrier layer,
   wherein the p-type ohmic electrode layer further comprises at least one bonding metal layer, the bonding metal layer comprising the same material as that of the contact metal layer.

2. The semiconductor device according to claim 1, wherein the contact metal layer comprises Ni.

3. The semiconductor device according to claim 2, wherein the p-type ohmic electrode layer is formed by sequentially laminating the contact metal layer, the reflective metal layer, the diffusion barrier layer, and the bonding metal layer.

4. The semiconductor device according to any one of claims 1 or 3, wherein the contact metal layer further comprises at least one of Ni, Pt, Pd, Au, Ti, Ru, W, Ta, V, Co, Os, Re, and Rh.

5. The semiconductor device according to any one of claims 1 to 3, wherein the reflective metal layer comprises at least one of Al and Ag.

6. The semiconductor device according to any one of claims 1 to 3, wherein the diffusion barrier layer comprises at least one of Ru, Ir, Re, Rh, Os, V, Ta, W, ITO (Indium Tin Oxide), IZO (Indium Zinc oxide), $RuO_2$, $VO_2$, MgO, $IrO_2$, $ReO_2$, $RhO_2$, $OsO_2$, $Ta_2O_3$, and $WO_2$.

7. The semiconductor device according to claim 2 or 3, wherein the bonding metal layer comprises first and second bonding metal layers, said first bonding metal layer comprising at least one of Ni, Cr, Ti, Pd, Ru, Ir, Rh, Re, Os, V, and Ta, said second bonding metal layer comprising at least one of Au, Pd, and Pt.

8. The semiconductor device according to claim 1, wherein the contact metal layer comprises a first layer and a second layer, and
   wherein the first layer comprises one of Ni, Pt, Pd, Au, Ti, Ru, W, Ta, V, Co, Os, Re, and Rh, and the second layer comprises Ir.

9. The semiconductor device according to claim 8, wherein the p-type ohmic electrode layer further comprises at least one bonding metal layer disposed on the diffusion barrier layer, the diffusion barrier layer being disposed between the reflective layer and the at least one bonding metal layer.

10. The semiconductor device according to claim 9, wherein the contact metal layer further comprises a third layer, and wherein the first layer comprises a Ni layer and the third layer comprises a Pt layer, and
   wherein the at least one bonding metal layer comprises a first bonding metal layer and a second bonding metal layer, the first bonding metal layer comprising at least one of Ni, Cr, Ti, Pd, Ru, Ir, Rh, Re, Os, V, and Ta, and the second bonding metal layer comprising at least one of Au, Pd, and Pt.

11. The semiconductor device according to claim 10, wherein the contact metal layer has a thickness in the range of 5 to 500 Å, the reflective layer has a thickness in the range of 100 to 9,000 Å, the diffusion barrier layer has a thickness in the range of 50 to 1,000 Å, the first bonding metal layer has a thickness in the range of 100 to 3,000 Å, and the second bonding metal layer has a thickness in the range of 100 to 9,000 Å.

12. The semiconductor device according to claim 11, wherein the thickness of the contact metal layer does not exceed 200 Å, the thickness of the reflective layer is in the range of 1,000 to 2,000 Å, the thickness of the diffusion barrier layer is in the range of 100 to 800 Å, the thickness of the first bonding metal layer does not exceed 1,000 Å, and the thickness of the second bonding metal layer does not exceed 1,000 Å.

13. The semiconductor device according to claim 1, wherein:
   the p-type ohmic electrode layer further comprises a first bonding metal layer and a second bonding metal layer;
   the contact metal layer is disposed directly on the gallium nitride-based semiconductor layer and further comprises a Ni layer and a Pt layer;
   the reflective layer is disposed directly on the contact metal layer and comprises an Ag layer;
   the diffusion barrier layer is disposed directly on the reflective layer and comprises a Ru layer;
   the first bonding metal layer is disposed directly on the diffusion barrier layer and comprises a Ni layer; and
   the second bonding metal layer is disposed directly on the first bonding metal layer and comprises an Au layer.

* * * * *